US006242316B1

(12) United States Patent
Joo

(10) Patent No.: US 6,242,316 B1
(45) Date of Patent: *Jun. 5, 2001

(54) SEMICONDUCTOR DEVICE HAVING CAPACITOR AND METHOD OF FABRICATING THE SAME

(75) Inventor: Jae-Hyun Joo, Cheongju (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/457,340

(22) Filed: Dec. 8, 1999

Related U.S. Application Data

(62) Division of application No. 09/151,601, filed on Sep. 11, 1998, now Pat. No. 6,034,392.

(30) Foreign Application Priority Data

Jun. 3, 1998 (KR) .................................... 98-20528

(51) Int. Cl.[7] .................................................. H01L 21/20
(52) U.S. Cl. .......................... 438/398; 438/396; 438/653; 438/652; 438/253; 438/239
(58) Field of Search .................................. 438/652, 653, 438/398, 239, 253, 396

(56) References Cited

U.S. PATENT DOCUMENTS

| 4,799,093 | 1/1989 | Kohara et al. ........................ 257/308 |
| 5,350,705 | 9/1994 | Brassington et al. ................ 257/308 |
| 5,436,477 | 7/1995 | Hashizume et al. ................. 257/308 |
| 5,479,317 | 12/1995 | Ramesh ............................. 361/321.5 |
| 5,504,041 | 4/1996 | Summerfelt ......................... 437/235 |
| 5,729,034 | 3/1998 | Park .................................... 257/308 |
| 5,741,722 | * 4/1998 | Lee ....................................... 437/60 |
| 6,046,093 | * 4/2000 | DeBoer et al. ...................... 438/398 |

* cited by examiner

Primary Examiner—Eddie C. Lee
Assistant Examiner—N. Drew Richards
(74) Attorney, Agent, or Firm—Morgan, Lewis & Bockius LLP

(57) ABSTRACT

The present invention relates to a capacitor and a method of fabricating the same including a semiconductor substrate, an impurity region in the semiconductor substrate, a first insulating layer on the semiconductor substrate, the first insulating layer having a first contact hole to expose the impurity region, a first conductive layer in the contact hole, a second conductive layer on the first insulating layer, a second insulating layer on the first insulating layer including the second conductive layer, the second insulating layer contacting the first portion of the second conductive layer, a lower electrode on the second insulating layer, the lower electrode being not directly contacting the first conductive layer, a dielectric layer on the lower electrode including the second insulating layer, and an upper electrode on the dielectric layer.

13 Claims, 15 Drawing Sheets

SEMICONDUCTOR DEVICE HAVING CAPACITOR AND METHOD OF FABRICATING THE SAME

This application is a divisional of Ser. No. 09/151,601 filed on Sep. 11, 1998 now U.S. Pat. No. 6,034,392, issued Mar. 7, 2000.

This application claims the benefit of Korean Application No. 98-20528 filed Jun. 3, 1998, now U.S. Pat. No. 6,034, 392 issued Mar. 2, 2000 which is hereby incorporated by reference.

BACKGROUND OF THE INVENTION

1. Field of the Invention

The present invention relates to a semiconductor device, and more particularly, to a semiconductor device having a capacitor and a method of fabricating the same. Although the present invention is suitable for a wide scope of applications, it is particularly suitable for preventing a contact between a plug and a lower electrode from being oxidized and for minimizing a contact resistance therein.

2. Discussion of the Related Art

As a density of semiconductor device becomes high, there has been an effort to fabricate a capacitor to keep a desired capacitance for a memory cell. One way to increase such capacitance is to utilize high dielectric materials such as $Ta_2O_5$, PZT(Pb(Zr Ti)$O_3$), BST((Ba Sr))$TiO_3$, or the like as a dielectric layer for a capacitor. Another way to increase the capacitance is to form a storage electrode having a stacked structure or a three-dimensional shape by using a trench in order to increase the surface area thereof.

FIG. 1 is a layout of capacitors according to the background art, and FIG. 2 shows a cross-sectional view of capacitors along with the line II–II' of FIG. 1. Transistors having gate electrodes and heavily-doped impurity region 120 of sources/drains in an active region defined by a field oxide layer are fabricated in a semiconductor substrate 100 where capacitors are formed according to the background art.

Further, as shown in FIGS. 1 and 2, an insulating layer 102 which has a contact hole C1 exposing the heavily-doped impurity region is formed on a semiconductor substrate 100. A plug 104-1 filling the contact hole C1 contacts the heavily-doped impurity region 120. The plug 104-1 is made of a material having an excellent step coverage such as doped polysilicon, tungsten or the like. A lower electrode 106-1 of the capacitor is formed on the insulating layer 102. The plug 104-1 is covered with the lower electrode 106-1 which electrically contacts the heavily-doped impurity region 120 through the plug 104-1. Then, a dielectric layer 108 and an upper electrode 112 are formed on the lower electrode 106-1 in this order.

In FIG. 1, the dielectric layer 108 and the upper electrode 106-1 which cover the lower electrode 106-1 are omitted for convenience. A circled portion indicated by a dotted line shows the plug 104-1 covered with by the lower electrode 106-1.

FIGS. 3A to 3C are cross-sectional views illustrating the process steps of fabricating method of capacitors according to the background art. A fabricating method of a capacitor having the aforementioned structure will be described as follows.

Initially referring to FIG. 3A, an insulating layer 102 is formed on a semiconductor substrate 100 having a transistor therein by depositing silicon oxide using chemical vapor deposition (CVD). A contact hole C1 is formed by patterning the insulating layer 102 to expose a heavily-doped impurity region 120.

A first conductive layer 104 is formed on the insulating layer 102 including the heavily-doped impurity region 120 through the contact hole C1. A thickness of the first conductive layer 104 is thick enough to completely fill up the contact hole C1. A material having an excellent step coverage, such as doped polysilicon, tungsten, or the like, may be an example for the first conductive layer 104 and formed by CVD.

Referring to FIG. 3B, a plug 104-1 electrically connected to the heavily-doped impurity region 120 is formed by etch-back the first conductive layer 104 until the top surface of the insulating layer 102 is exposed so that only a portion of the conductive layer 104 remains in the contact hole C1. A second conductive layer 106 (for example, platinum) is then formed on the insulating layer 102 including the plug 104-1. Having a low reactivity and a desirable interfacial characteristic, platinum (Pt) is widely used for forming a lower electrode of a capacitor. Subsequently, a photoresist pattern 110 defining a lower electrode of a capacitor is formed on the second conductive layer 106.

Referring to FIGS. 3C, a lower electrode 106-1 is formed by removing a portion of the second conductive layer 106 using the photoresist pattern 110 as a mask. After the photoresist pattern 110 is removed, a dielectric layer 108 is deposited on the insulating layer 102 including the lower electrode 106-1. For instance, a high dielectric constant material 108, such as $Ta_2O_5$, PZT(Pb(Zr Ti)$O_3$), BST((Ba Sr)$TiO_3$, or the like, may be used for the dielectric layer. When the dielectric layer having a high dielectric material is formed, Rapid Thermal Processing (RTP) is accompanied under oxygen atmosphere in order to prevent the dielectric layer from being metalized by substituting oxygen with carbon. A background art capacitor is completed by forming an upper electrode 112 on the dielectric layer 108.

However, when a thermal treatment is performed on the dielectric layer in the background art, oxygen is diffused through the lower electrode due to an excessive heat, thereby oxidizing the surface of the plug in contact with the lower electrode. Consequently, a contact resistance becomes high and the capacitor may be short-circuited with the transistor.

SUMMARY OF THE INVENTION

Accordingly, the present invention is directed to a capacitor and a method of fabricating the same that substantially obviates one or more of the problems due to limitations and disadvantages of the related art.

An object of the present invention is to provide a capacitor in a semiconductor device having a low contact resistance between a plug and a lower electrode of a capacitor by forming a conductive layer between a plug and a lower electrode.

Another object of the present invention is to provide a method of fabricating a capacitor having a low contact resistance between a plug and a lower electrode of a capacitor by preventing the plug surface from being oxidized in the process of thermal treating the dielectric layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a capacitor includes a semiconductor substrate, an impurity region in the semiconductor substrate, a first insulating layer on the semiconductor substrate, the first insulating layer having a first contact hole to expose the impurity region, a first conductive layer in the contact hole, a second conductive layer on the first insulating layer, a second insulating layer on the first insulating layer including the second conductive layer, the second insulating layer contacting the first portion of the second conductive layer, a lower electrode on the second insulating layer, the lower electrode being not directly contacting the first conductive layer, a dielectric layer on the lower electrode including the second insulating layer, and an upper electrode on the dielectric layer.

In another aspect of the present invention, a method of fabricating capacitor includes the steps of forming a first insulating layer on a semiconductor substrate wherein a transistor having an impurity region is formed on the semiconductor substrate and a contact hole which discloses the impurity region is formed in the first insulating layer, forming a plug filling up the contact hole, forming a first conductive layer on the first insulating layer wherein a portion of the first conductive layer corresponds to the plug and the other portion of the first conductive layer does not correspond to the plug, forming a second insulating layer on the first insulating layer wherein the second insulating layer covers the portion of the first conductive layer and discloses the other portion of the first conductive layer, forming a lower electrode covering a side of the second insulating layer and the other portion of the first conductive layer, forming a dielectric layer covering the lower electrode, and forming an upper electrode covering the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
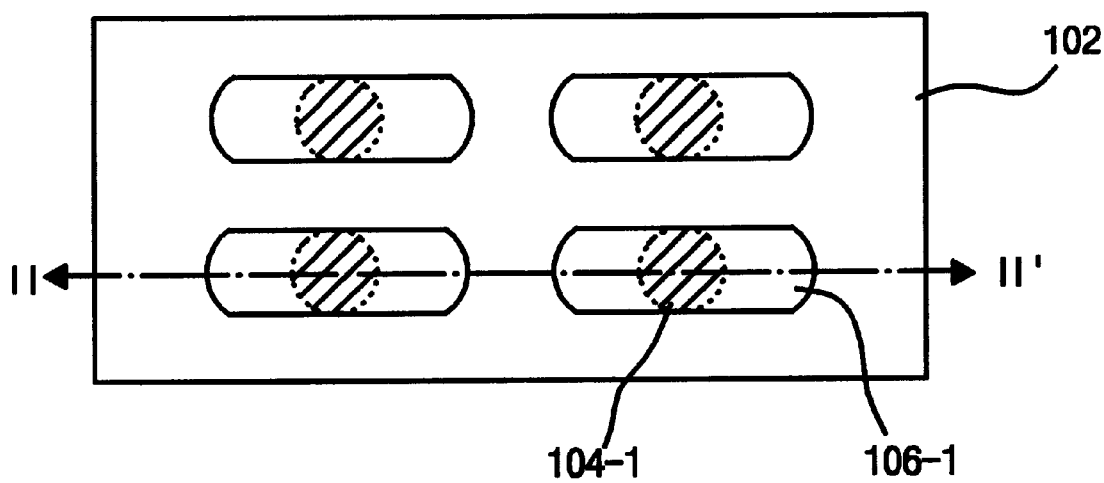
FIG. 1 is a layout of capacitors according to the background art.
Figure 2:
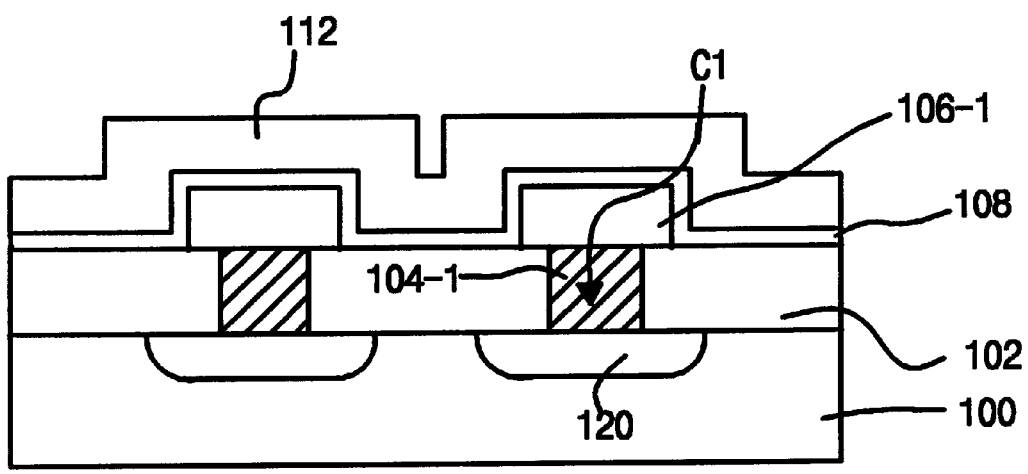
FIG. 2 is a cross-sectional view of capacitor according to the background art along with the line II–II' of FIG. 1.
Figure 3A:
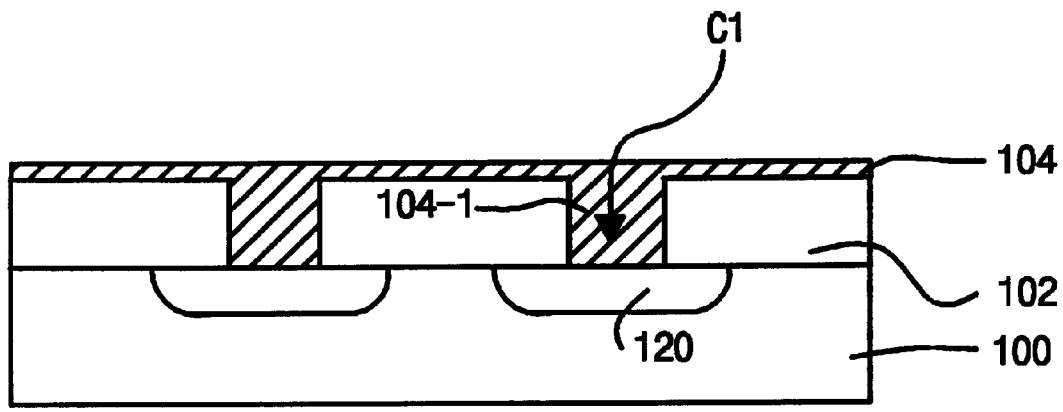
FIGS. 3A to 3C are cross-sectional views illustrating the process steps of fabricating method of capacitors according to the background art.
Figure 3B:
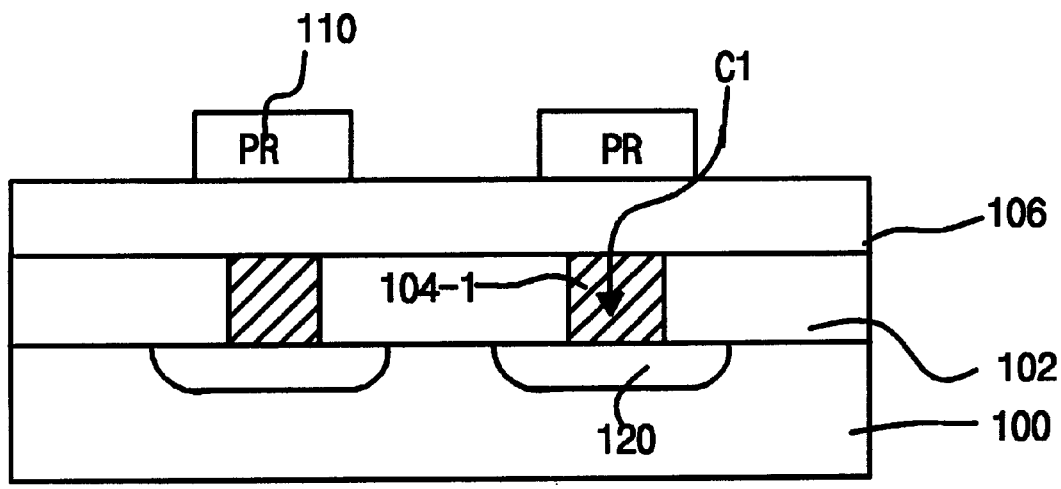
Figure 3C:
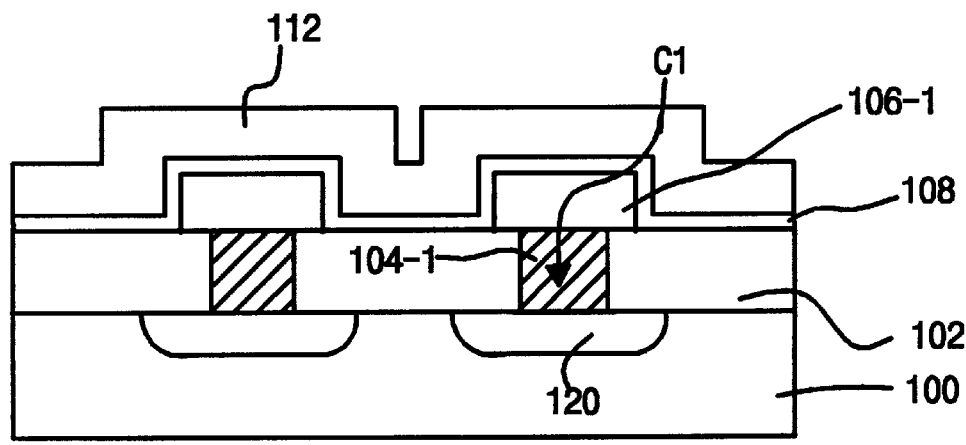
Figure 4:
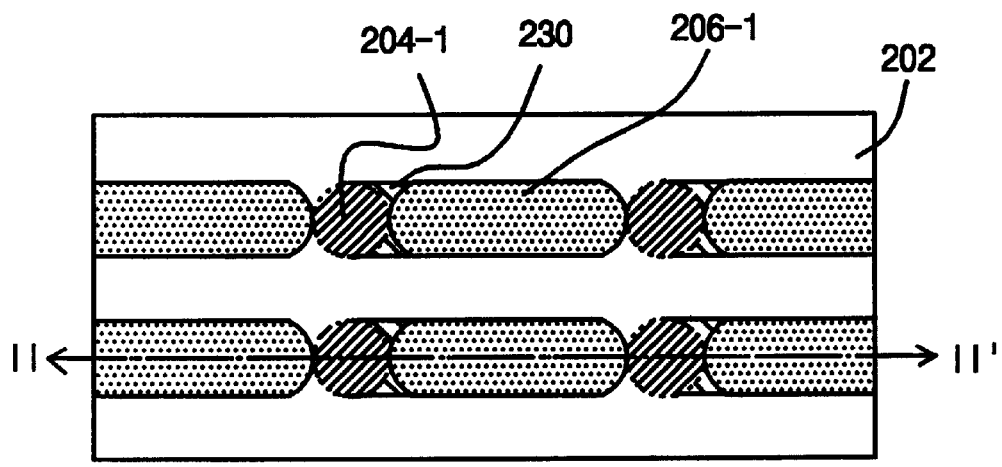
FIG. 4 is a layout of capacitors according to a first embodiment of the present invention.
Figure 5:
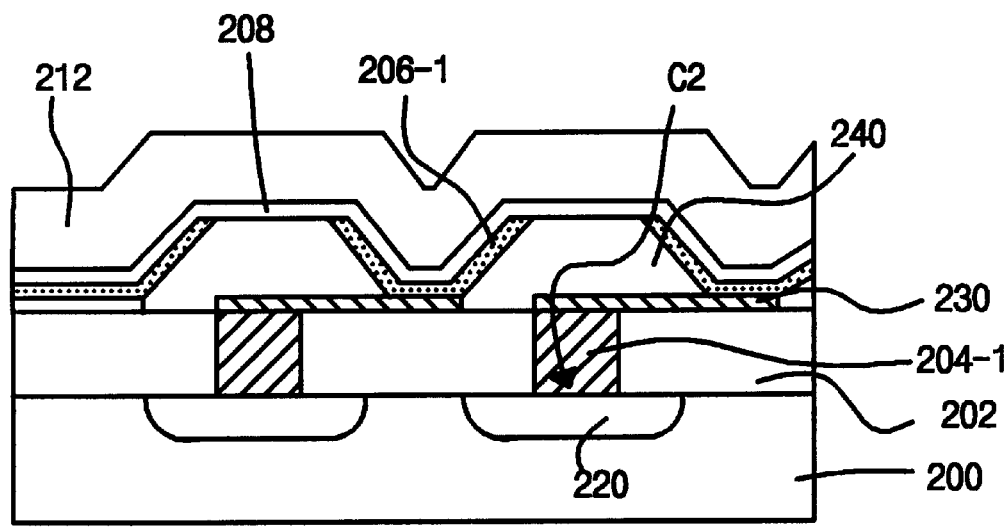
FIG. 5 is a cross-sectional view of capacitors along with the line V–V' of FIG. 4.

Referring to FIGS. 4 and 5, a first insulating layer 202 which has a contact hole C2 exposing a heavily-doped impurity region 220 is formed in a semiconductor substrate 200 of the above-explained structure. Transistors having gate electrodes and heavily-doped impurity regions of sources/drains in an active region defined by a field oxide layer are formed in a semiconductor substrate where semiconductor capacitors are formed. A plug 204-1 contacts the heavily-doped impurity region 220 is formed in the contact hole C2. The plug 204-1 is made of a material having an excellent step-coverage, such as doped polysilicon, tungsten, or the like.

A conductive layer 230 is then formed on the first insulating layer 202. In this process, the conductive layer 230 is formed to have a portion of the conductive layer 230 in contact with the plug 204-1 and the other portion of the conductive layer 230 does not contact the plug 204-1. The conductive layer 230 is electrically connected to the heavily-doped impurity region 220 through the plug 204-1.

A second insulating layer 240 having sloped sides is formed on the first insulating layer 202 including the conductive layer 230. A lower electrode 206-1 is formed on the sloped sides of the second insulating layer 240 and a portion of the conductive layer 230. A dielectric layer 208 and an upper electrode 212 are formed on the lower electrode 206-1 including a portion of the second insulating layer 240 in this order.

In FIG. 4, the dielectric layer and the upper electrode which cover the lower electrode of the capacitor are omitted for convenience and a circled portion indicated by a dotted line shows that the plug 204-1 is not covered with the lower electrode 206-1.

A fabricating method of capacitors having the aforementioned structure according to the first embodiment of the present invention will be described with reference to the accompanying drawings.

Figure 6A:
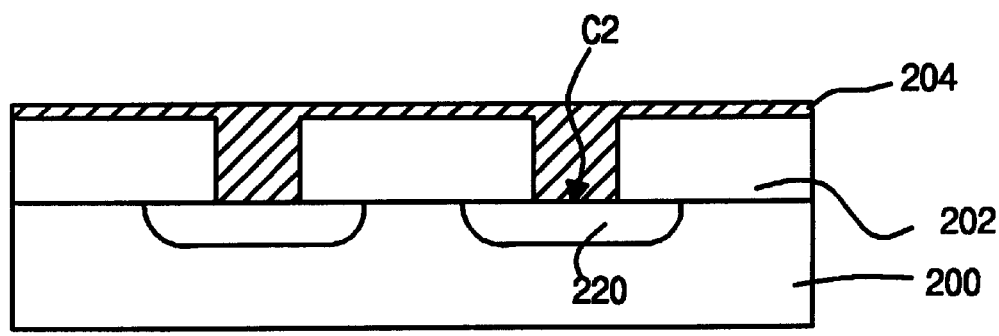
FIGS. 6A to 6D are cross-sectional views illustrating the process steps of fabricating capacitors according to the first embodiment of the present invention.

Referring initially to FIG. 6A, a first insulating layer 202 is formed on a semiconductor substrate 200 having a transistor by depositing a material such as silicon oxide using CVD. A contact hole C2 is formed by patterning the first insulating layer 202 to expose a portion of a heavily-doped impurity region 220. Thereafter, a first conductive layer 204 is formed on the first insulating layer 202 including the heavily-doped impurity region 220. A thickness of the first conductive layer 204 is thick enough to fill up the contact hole C2 by depositing a material having an excellent step-coverage, such as doped polysilicon, tungsten or the like using CVD.

Figure 6B:
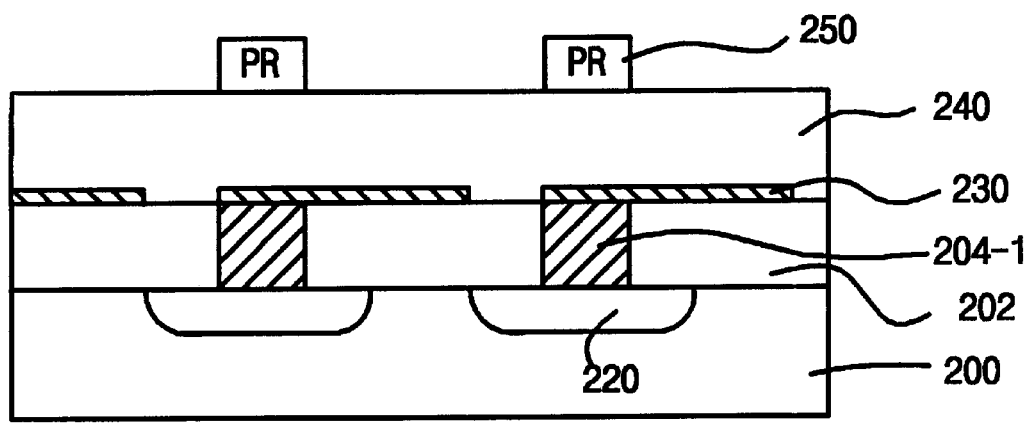

Referring to FIG. 6B, a plug 204-1 electrically connected to the heavily-doped impurity region 220 is formed by etching back the first conductive layer 204 until the surface of the first insulating layer 202 is exposed, thereby completely filling the contact hole C2. A metal layer is formed to cover the plug 204-1 on the first insulating layer 202 including the plug 204-1. A second conductive layer 230 is then patterned to completely cover the plug 204-1 and a portion of the first insulating layer 202. A metal such as Pt, Pd, Mo, Co, or Ni, or an oxidized conductive material such as Ru, Ir, Os, or Sn is used for the second conductive layer 230 which may be stacked multiply. If a metal such as Al is used for the second conductive layer 230, the lower electrode of a capacitor is disconnected electrically from the plug because of forming an electrical nonconductor such as $Al_2O_3$. This is resulted from a reaction between the metal and oxygen which has been passed through the lower electrode of a capacitor. Accordingly, Al is not a good candidate for the second conductive layer.

By shifting to a proper position, a mask for defining a lower electrode of a capacitor can also be used for patterning the second conductive layer. Hence, an additional mask for patterning the second conductive layer is not necessary.

In addition, a diffusion barrier layer (not shown) such as Ti, TiN, TaN or TiW may be formed between the plug 204-1 and the second conductive layer 230 to prevent a portion of the second conductive layer from diffusing into the plug 204-1. A second insulating layer 240 is formed on the first insulating layer 202 to have a thickness thick enough to cover the second conductive layer 230. Then, a photoresist pattern 250 defining a lower electrode of a capacitor is formed on the second insulating layer 240. Therefore, the second conductive layer 230 and the second insulating layer 240 are patterned respectively by properly locating the same mask. In addition, an adhesive layer (not shown) may be formed between the second conductive layer 230 and the second insulating layer 240 to enhance the adhesion between the two layers. The adhesive layer is made of a material having an excellent adhesion such as Ti, and Ta.

Figure 6C:
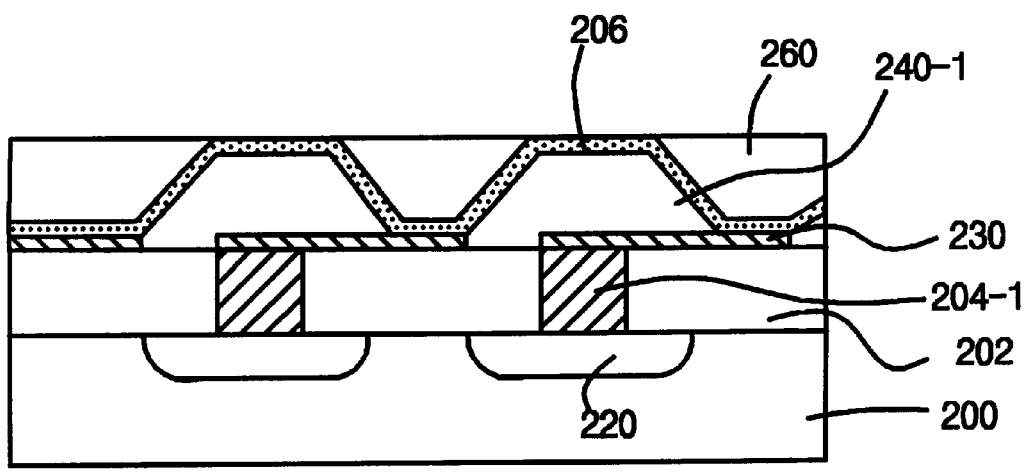

Referring to FIG. 6C, a second insulating layer 240-1 is patterned by a proper combination of wet/dry etching using the photoresist pattern 250 as a mask. As a result, the second insulating layer 240-1 having slant sides covers a portion of the second conductive layer 230 corresponding to the plug 204-1 and exposes the other portion of the second conductive layer 230. Thereafter, the photoresist pattern 250 is removed. A third conductive layer 206 is then formed on the first insulating layer 202 to cover the second conductive layer 230 and the second insulating layer 240-1. As the second conductive layer 240 is formed, the third conductive layer 206 is formed by an oxidized conductive layer such as Ru, Ir, Os, or Sn, or a metal layer of Pt, Pd, Mo, Co, or Ni. The third conductive layer 206 is formed by stacking a single layer or the layers of the metal layer or the oxidized conductive layer. The third conductive layer 206 includes at least one element of the metals and the conductive materials.

In addition, an adhesive layer (not shown) may be formed between the slant sides of the second insulating layer 240-1 and the third conductive layer 206 to enhance the adhesion between the two layers. The adhesive layer is made of a material having an excellent adhesion such as Ti or Ta.

A filling layer 260 is formed for planarization on the third conductive layer 206 using a photoresist or spin on glass (SOG). The filling layer 260 and the third conductive layer 206 are removed by etch-back or chemical-mechanical polishing (hereinafter abbreviated CMP) until a portion of the surface of the second insulating layer 240-1 is exposed as shown in FIG. 6C.

Figure 6D:
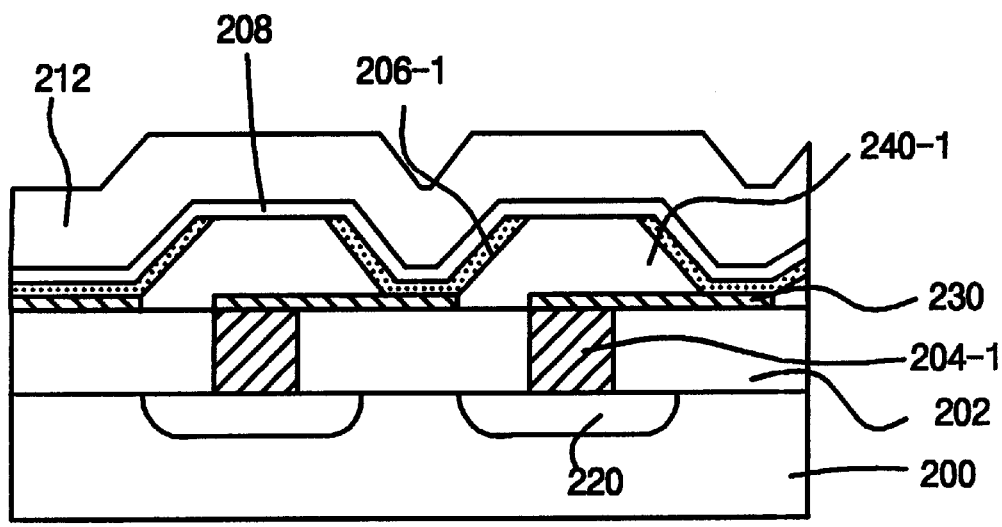

Referring to FIG. 6D, the remaining third conductive layer 206 becomes a lower electrode 206-1 of a capacitor. Then, the filling layer 260 remaining between the lower electrodes are removed. In this process, a method of forming the filling layer on the slant surface of the third conductive layer to be protected from etch-back or CMP is used because the third conductive layer is difficult to maintain its shape due to a relatively thin thickness. Covering the slant surfaces of the second insulating layer 240-1, the lower electrode 206-1 of a capacitor has the same shape as the sides of the second insulating layer. Accordingly, the whole surface of the lower electrode of a capacitor having the slant surface per unit space is wider than that of the background art capacitor having a vertical profile.

A fabrication of a capacitor is completed after a dielectric layer 208 covering the lower electrode 206-1 and an upper electrode 212 are formed in this order. A high dielectric material such as $Ta_2O_5$, PZT(Pb(Zr Ti)$O_3$), or BST((Ba Sr)Ti$O_3$ may be used for the dielectric layer 208. Assuming $Ta_2O_5$ is chosen for the dielectric layer, a layer of $Ta_2O_5$ may be formed by reacting Ta(OC$_2$H$_5$) 5 of a processing gas with $O_2$. Lots of impurities such as carbon in an atomic or radical state remain in a process chamber where $Ta_2O_5$ is formed. $Ta_2O_5$ is metalized by the substituting reaction when oxygen of $Ta_2O_5$ is replaced by carbon of the impurities. When $Ta_2O_5$ becomes metalized the dielectric, layer becomes conductive. A leakage current may thus be generated through the layer. Further, a bonding state between Ta and O is unstable. Accordingly, RTP under oxygen atmosphere is required for stabilizing $Ta_2O_5$. Consequently, carbon in atomic and radical states remaining on the surface of Ta205 during the deposition process becomes volatile carbon dioxide. Thus, the electrical characteristics of the dielectric layer are improved by preventing the metalization of Ta205 and by reducing impurities remaining in the process chamber.

However, during the thermal treatment under high temperature, the plug is easily oxidized due to the diffusion of oxygen coming from $Ta_2O_5$ into a lower electrode of a capacitor. The present invention prevents the surface of the plug from being oxidized by oxygen having passed through the lower electrode achieved by forming a second conductive layer between the plug and the lower electrode of a capacitor. In other words, by avoiding direct contact, the plug and the lower electrode are electrically connected with each other.

When Al is used for the second conductive layer in the present invention, $Al_2O_3$ of insulating material appears due to oxygen passed through the lower electrode. The present invention employs the oxidized conductive material including conductive material as the second conductive layer.

A second embodiment of the present invention will be described with reference to FIG. 7 and FIGS. 8A to 8D.

Figure 7:
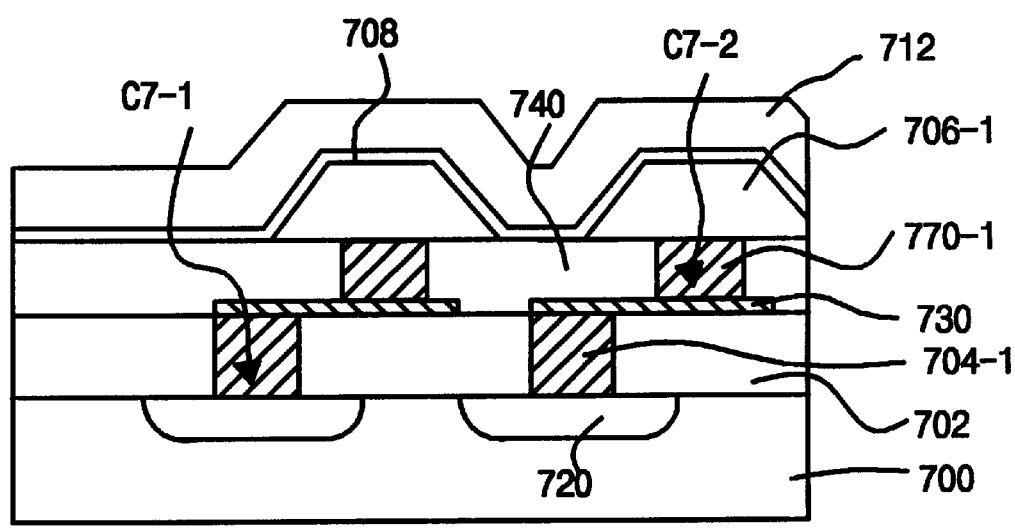
FIG. 7 is a cross-sectional view of capacitors according to a second embodiment of the present invention.

Referring to FIG. 7, a first insulating layer 702 having a first contact hole C7-1 exposing a heavily-doped impurity region 720 of a source/drain on a semiconductor substrate 700 having transistors. A first plug 704-1 is formed in the first contact hole C7-1. A conductive layer 730 having a portion corresponding to and the other portion extending away from the first plug 704-1 is formed on the first insulating layer 702. A second insulating layer 740 covering a portion of the conductive layer 730 has a second contact hole C7-2 around the other portion of the conductive layer 730 on the conductive layer 730. A second plug 770-1 is formed in the second contact hole C7-2. For example, a material having an excellent step coverage such as tungsten and doped polysilicon is used for the first plug 702-1 and the second plug 770-1. A lower electrode 706-1 covering the second plug 770-1, a dielectric layer 708 and an upper electrode 712 of a capacitor are stacked on the second insulating layer 740 in this order.

A fabricating method of a capacitor having aforementioned structure of the second embodiment of the present invention with reference to FIGS. 8A to 8D.

Figure 8A:
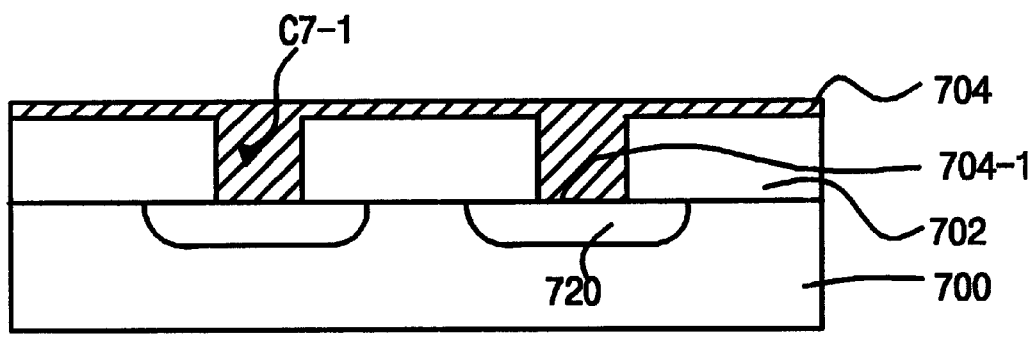
FIGS. 8A to 8D are cross-sectional views illustrating the process steps of fabricating capacitors according to the second embodiment of the present invention.

Referring initially to FIG. 8A, a first insulating layer 702 having a first contact hole C7-1 exposing a heavily-doped impurity region 720 of a source/drain is formed on a semiconductor substrate 700 having transistors. A first conductive layer 704 is formed on the first insulating layer 702 by depositing a material having an excellent step coverage such as tungsten and polysilicon doped heavily with impurities.

Figure 8B:
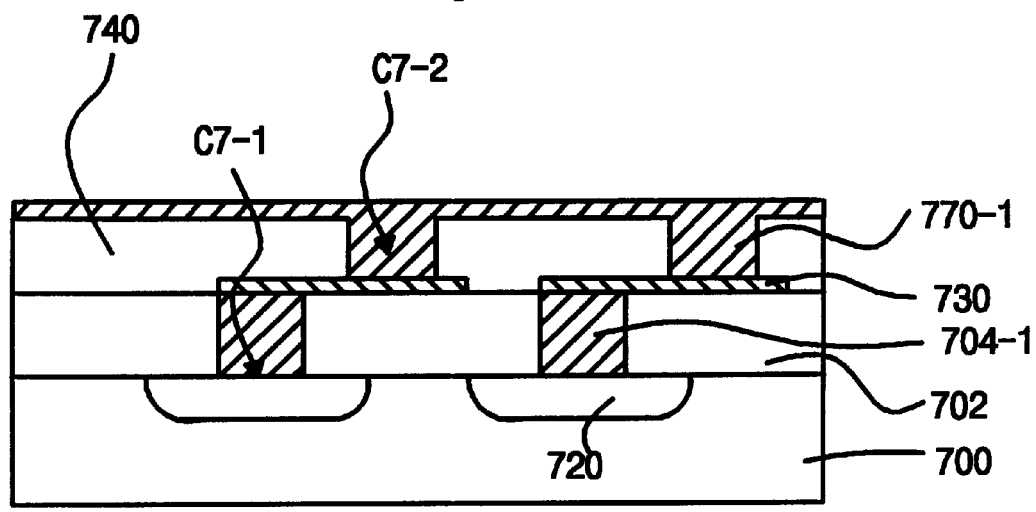

Referring to FIG. 8B, a plug 704-1 electrically connected to the heavily-doped impurity region 720 is formed by etching back the first conductive layer 704 until the surface of the first insulating layer 702 is exposed and the first conductive layer 704 completely fills the first contact hole C7-1. Then, a second conductive layer 730 is formed to cover the plug 704-1 on the first insulating layer 702. The second conductive layer 730 having a portion etched to correspond to the first plug 704-1 and the other portion extending away from the first plug 704-1 is patterned by etching. A metal such as Pt, Pd, Mo, Co, or Ni, or an oxidized conductive material such as Ru, Ir, Os, or Sn is used for forming the second conductive layer 730 which may be stacked multiply.

Next, a second insulating layer 740 covering a portion of the second conductive layer 730 has a second contact hole C7-2 around the other portion of the second conductive layer 730 on the first insulating layer 702. Then, a third conductive layer 770 is formed on the second insulating layer 740 by depositing the same material as the first conductive layer 704.

Figure 8C:
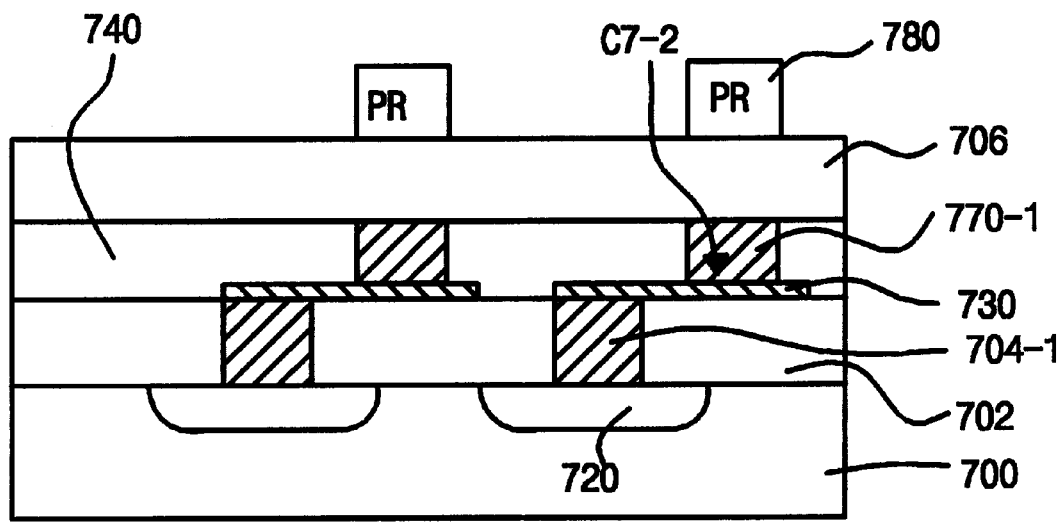

Referring to FIG. 8C, a second plug 770-1 filled the second contact hole C7-2 is formed by etching back the third conductive layer 770. The first and the second plug 704-1 and 770-1 are electrically coupled to each other through the second conductive layer 730 without a direct contact. A fourth conductive layer 706 is formed on the second insulating layer 740 by depositing the same material as the second conductive layer 730. Then, a photoresist pattern 780 is defined on the fourth conductive layer 706.

Figure 8D:
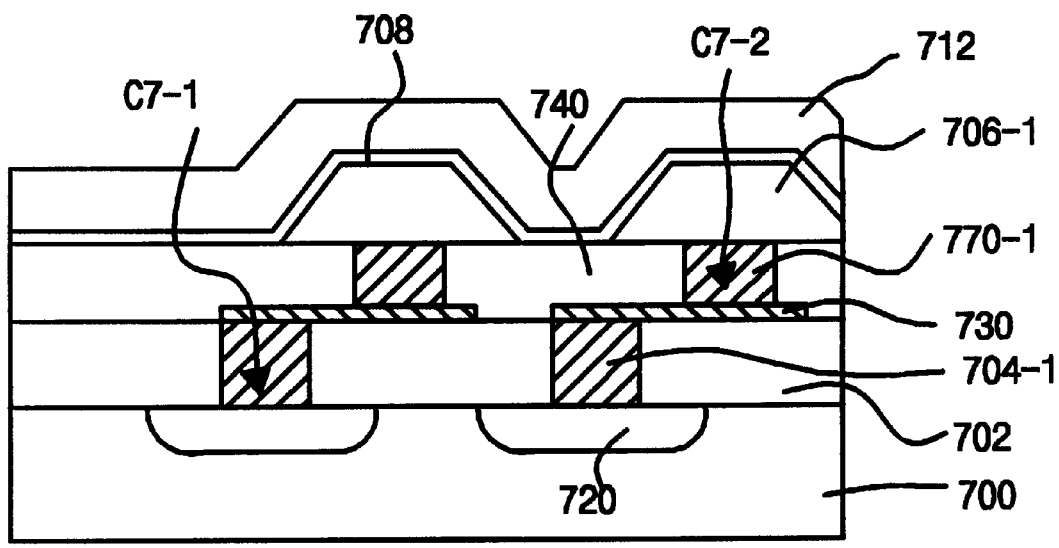

Referring to FIG. 8D, a lower electrode 706-1 is formed by removing a portion of the fourth conductive layer 706 using the photoresist pattern 780 as a mask. The photoresist pattern is then removed. A dielectric layer 708 covering the lower electrode 706-1 is formed. Although the diffusion of oxygen through the lower electrode may be in progress during the heat treatment for forming the dielectric layer, the first plug is free from oxidation. This is due to oxygen passed through the lower electrode and a reduced contact resistance since the first plug is not directly in contact with the lower electrode while it is connected with the lower electrode through the second conductive layer and the second plug. Then, an upper electrode 712 is formed on the dielectric layer 708.

A third embodiment of the present invention will be explained with reference to FIG. 9 and FIGS. 10A to 10D.

The third embodiment of the present invention is a variation from the second embodiment of the present invention.

Figure 9:
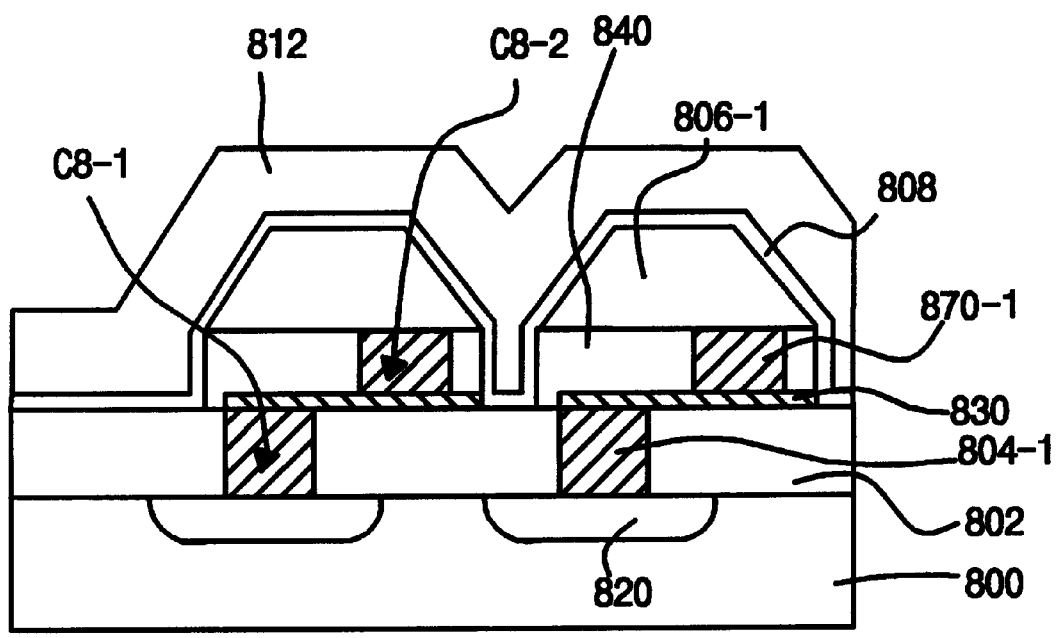
FIG. 9 is a cross-sectional view of capacitors according to a third embodiment of the present invention.

Referring to FIG. 9, a first insulating layer 802 having a first contact hole C8-1 to expose a heavily-doped impurity region 820 of a source/drain is formed on a semiconductor substrate 800 which has transistors. A first plug 804-1 is formed inside the first contact hole C8-1. A second conductive layer 830 having a first portion directly contacting the first plu 804-1 and a second portion extending away from the first plug 804-1 is formed on the first insulating layer 802.

Thereafter, a second insulating layer 840 covering a portion of the second conductive layer 830 and having a second contact hole C8-2 over the second portion of the second conductive layer 830 is formed on the first insulating layer 802 including the second conductive layer 830. A second plug 870 is then formed in the second contact hole C8-2. The second insulating layer 840 is patterned to have a contact area the same as the lower electrode of a capacitor. Subsequently, a lower electrode 806-1 covering the second insulating layer 840, a dielectric layer 808 and an upper electrode 812 are stacked in this order.

FIGS. 10A to 10E are cross-sectional views illustrating the process steps of fabricating method of capacitors according to the third embodiment of the present invention.

Figure 10A:
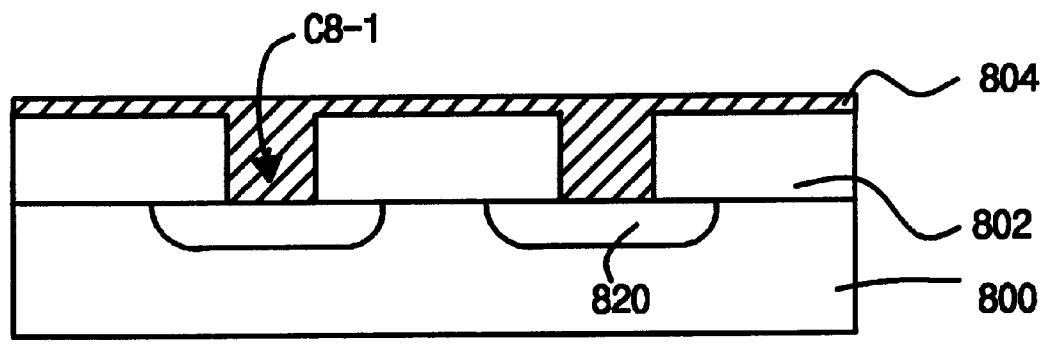
FIGS. 10A to 10D are cross-sectional views illustrating the process steps of fabricating capacitors according to the third embodiment of the present invention.

Referring to FIG. 10A, a first insulating layer 802 having a first contact hole C8-1 to expose a heavily-doped impurity region 820 of a source/drain is formed on a semiconductor substrate 800 which has transistors. A first conductive layer 804 is formed on the first insulating layer 802 by depositing a material having an excellent step coverage, such as tungsten, heavily-doped polysilicon.

Figure 10B:
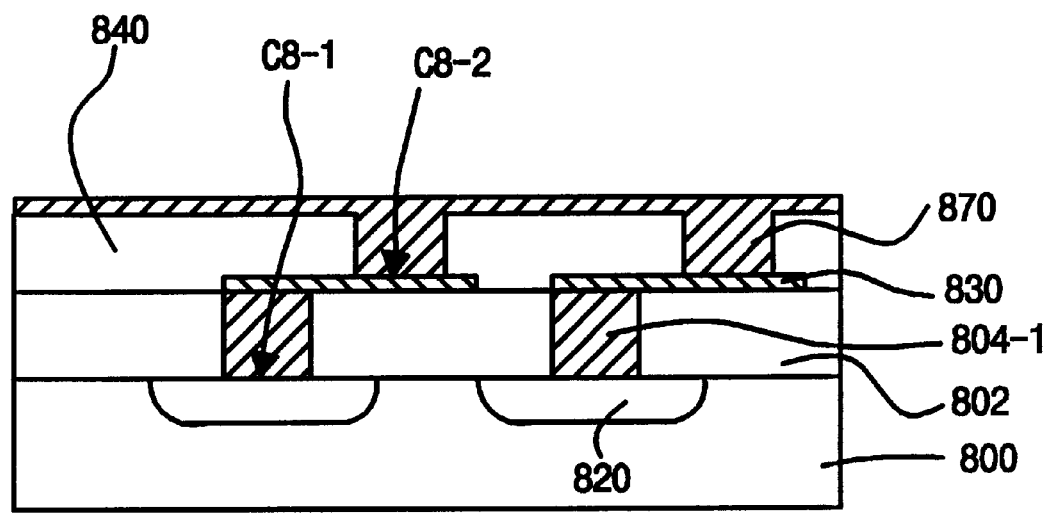

Referring to FIG. 10B, a plug 804-1 electrically connected to the impurity region 820 formed by etching back the first conductive layer 804. In this process, the etch-back is performed until the surface of the first insulating layer 802 is exposed and the first insulating layer 802 completely fills the first contact hole C8-1. Then, a second conductive layer 80 is formed to cover the first plug 804-1 on the first insulating layer 802. The second conductive layer 830 is patterned to have a first portion directly contacting the first plug 804-1 and a second portion extending away from the first plug 804-1. For forming a stacked structure of the second conductive layer 830, for example, a metal such as Pt, Pd, Mo, Co, or Ni, or an oxidized conductive material such as Ru, Ir, Os, or Sn, or a film (metal or oxidized material) containing at least one of these metals and the oxidized conductive material may be used for this purpose.

Next, a second insulating layer 840 is formed on the first insulating layer to cover the first portion of the second conductive layer 830 and to have a second contact hole C8-2 over the first insulating second portion of the second conductive layer 830. Then, a third conductive layer 870 is formed on the second insulating layer 840. In this process, the third conductive layer 870 is formed to have the material the same as the first conductive layer.

Figure 10C:
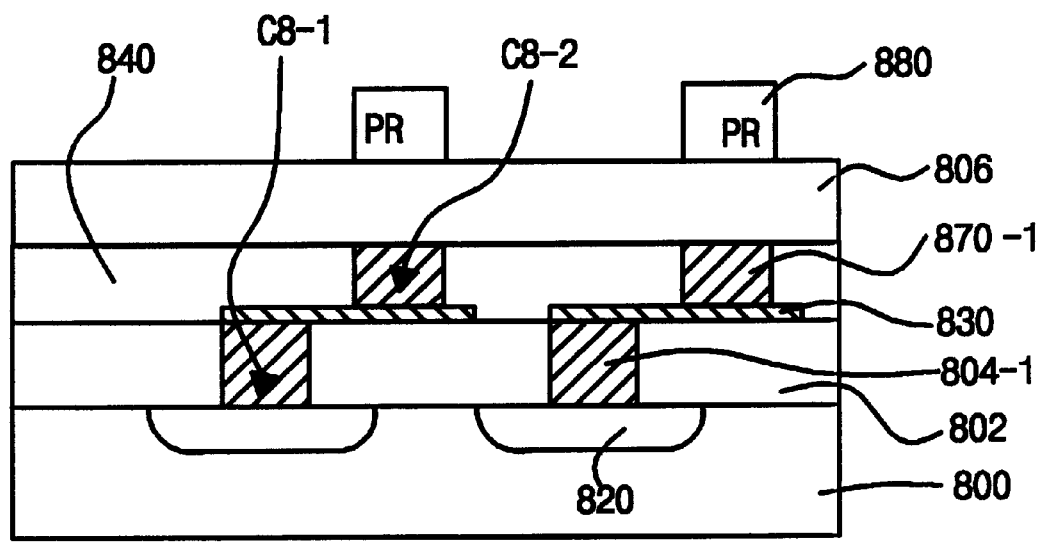

Referring to FIG. 10C, a second plug 870-1 is formed in the second contact hole C8-2 by etching back the third conductive layer 870. The first and the second plugs 804-1 and 870-1 are electrically coupled each other through the second conductive layer 830. A fourth conductive layer 806 is formed on the second insulating layer 840 by depositing the material the same as the second conductive layer 830. A photoresist pattern 880 is then formed on the fourth conductive layer 806.

Figure 10D:
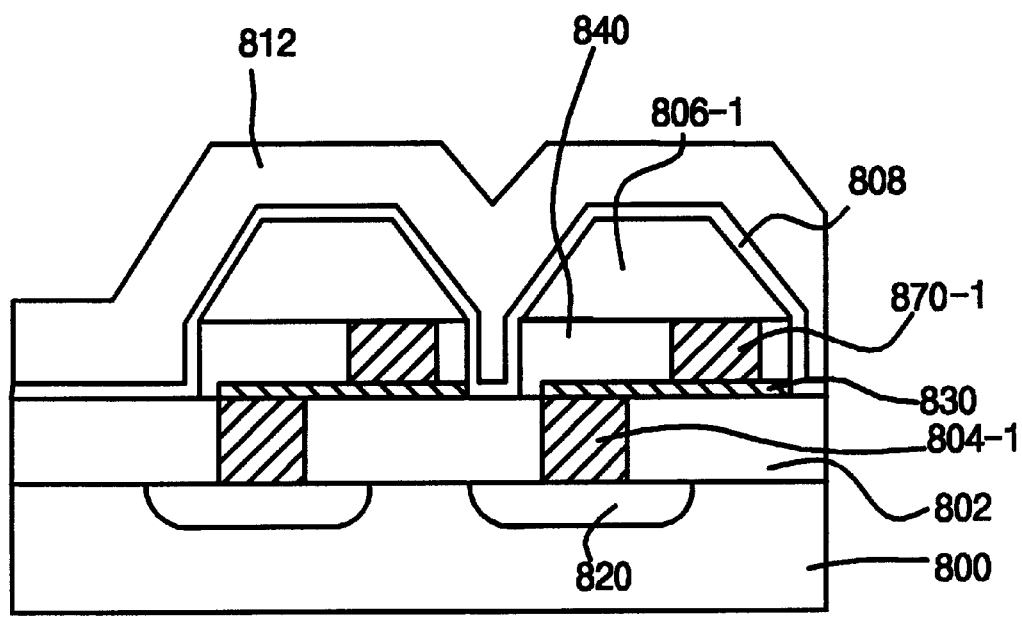

Referring to FIG. 10D, a lower electrode 806-1 is formed by removing a portion of the fourth conductive layer 806 using the photoresist pattern 880 as an etch mask. In this process, the lower electrode 806-1 is patterned to have slant sides. Then, the photoresist pattern is removed from the lower electrode 806-1. A portion of the surface of the first insulating layer 802 not covered with the lower electrode 806-1 is exposed by removing a portion of the second insulating layer 840 using the lower electrode 806-1 as an etch mask.

Thereafter, a dielectric layer 808 is formed on the lower electrode 806-1. Although oxygen may diffuse into the lower electrode during heat treatment in the process of forming the dielectric layer, the first plug 804-1 is free from oxidation. In this process, the oxygen passes through the lower electrode and a contact resistance is reduced because the first plug 804-1 is not directly in contact with the lower electrode but is connected with the lower electrode through the second conductive layer and the second plug. An upper electrode 812 is then formed on the dielectric layer 808.

Figure 11:
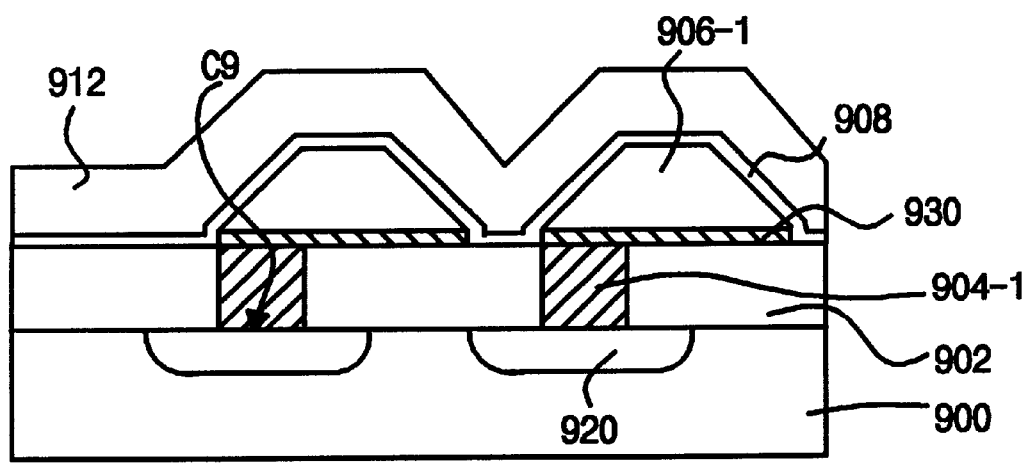
FIG. 11 is a cross-sectional view of capacitors according to a fourth embodiment of the present invention.

Referring initially to FIG. 11, a first insulating layer 902 having a contact hole C9 to expose a heavily-doped impurity region 920 of a source/drain is formed on a semiconductor substrate 900 having transistors. A plug 904-1 is then formed in the first contact hole C9. A conductive layer 930 is formed on the insulating layer 902. The conductive layer 930 has a first end portion directly contacting the plug 904-1 and a second end portion extending away from the plug 904-1. Subsequently, a lower electrode 906-1, a dielectric layer 908, and an upper electrode 912 are stacked in this order.

Figure 12A:
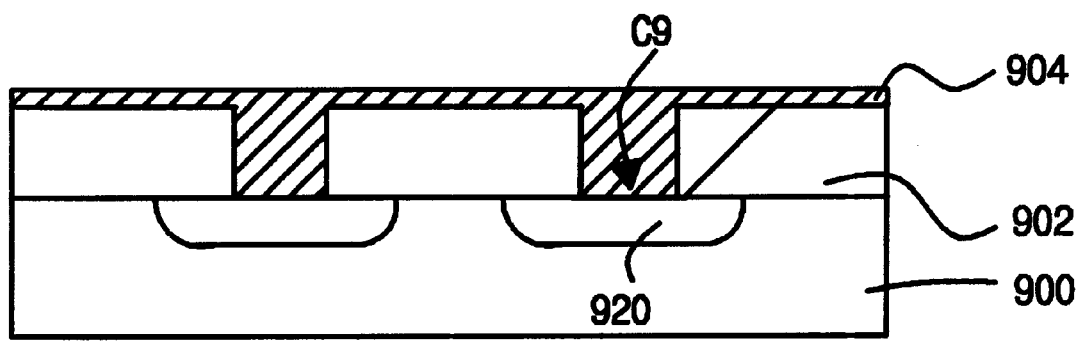
FIGS. 12A to 12C are cross-sectional views illustrating the process steps of fabricating capacitors according to the fourth embodiment of the present invention.
Figure 12B:
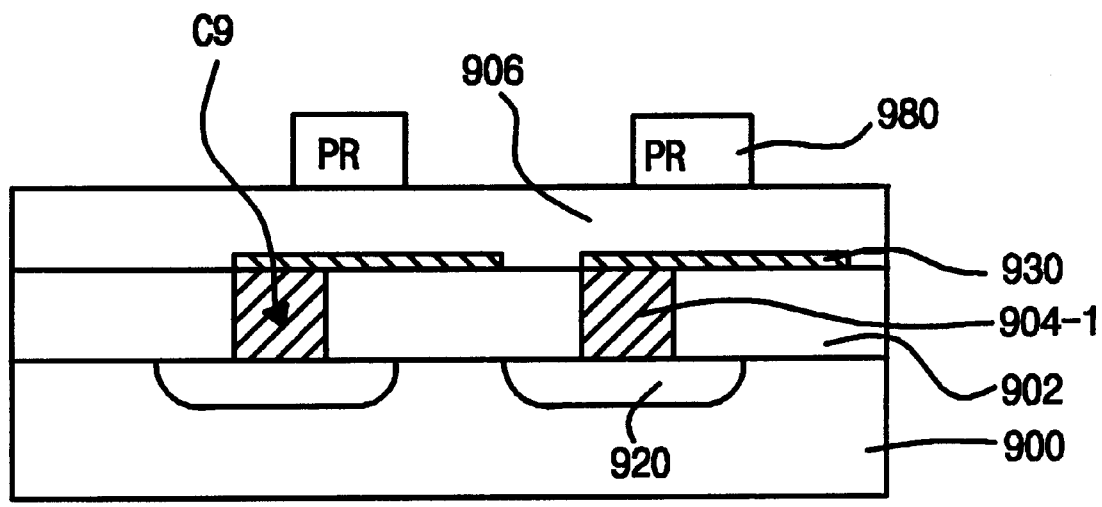
Figure 12C:
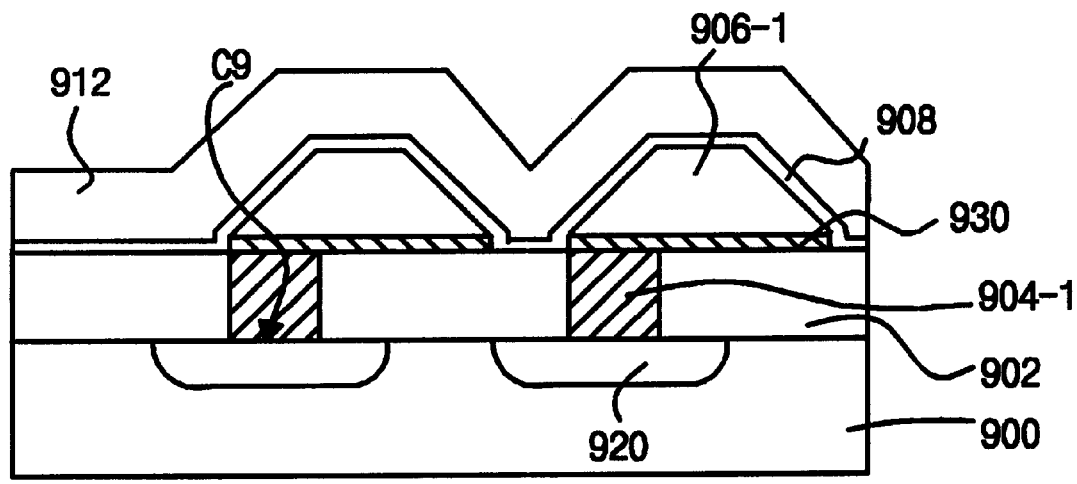

FIGS. 12A to 12C are cross-sectional views illustrating the process steps of fabricating method of a capacitor according to the fourth embodiment of the present invention.

Referring to FIG. 12A, an insulating layer 902 is formed on a semiconductor substrate 900 to have a contact hole C9 exposing a heavily-doped impurity region 920 of a source/drain. A first conductive layer 904 is formed in the contact hole C9 including on the insulating layer 902

Referring to FIG. 12B, a plug 904-1 is formed by etching back the first conductive layer 904. A second conductive layer 930 is then formed on the plug 904-1 including the insulating layer 902. Thereafter, a third conductive layer 906 is formed on the first insulating layer 902 including the second conductive layer 930. A photoresist pattern 980 to define a lower electrode is formed on the third conductive layer 906. For example, a metal such as Pt, Pd, Mo, Co, or Ni, or an oxidized conductive material including Ru, Ir, Os, or Sn may be used for both the second conductive layer 930 and the third conductive layer 906. Alternatively, a layer (a metal or oxidized material) or multiple layers containing at least one of these metals and the oxidized conductive materials.

Referring to FIG. 12C, a lower electrode 906-1 is formed by removing a portion of the third conductive layer 906 using the photoresist pattern 980 as an etch mask. In this process, the lower electrode 906-1 is patterned to have a slant side. The photoresist pattern 980 is then removed from the third conductive layer 906. A dielectric layer 908 is formed on the lower electrode 906-1 by depositing a high dielectric material. Subsequently, an upper electrode 912 is formed on the dielectric layer 908.

As explained above, although the plug is not directly in contact with the lower electrode, it is electrically coupled to the lower electrode through the second conductive layer. Hence, the second conductive layer blocks oxidation of the plug during thermal treatment for forming the dielectric layer 908.

A fifth embodiment of the present invention will be described with reference to FIG. 13 and FIGS. 14A to 14D.

Figure 13:
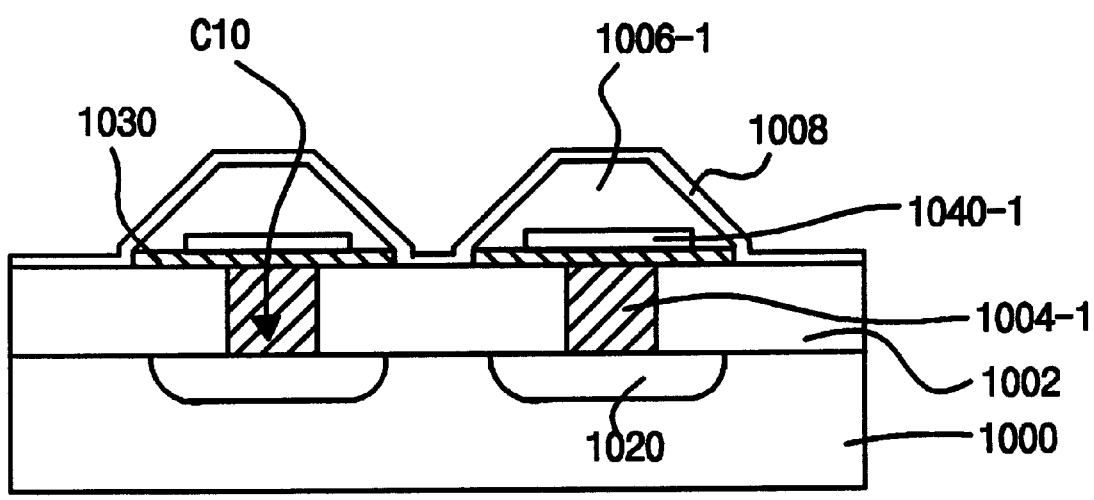
FIG. 13 is a cross-sectional view of capacitors according to a fifth embodiment of the present invention.

Referring initially to FIG. 13, a first insulating layer 1002 is formed to have a contact hole C10 exposing a heavily-doped impurity region 1020 (a source/drain) on a semiconductor substrate 1000. A plug 1004-1 is then formed in the contact hole C10.

Thereafter, a conductive layer 1030 and an oxidation resistant layer 1040-1 are formed on the plug 1004-1 including the insulating layer 1002 in this order. A width of the conductive layer 1030 is formed to be at least larger than that of the oxidation resistant layer 1040-1, so that the surface of the conductive layer 1030 is sufficiently in contact with the lower surface of the oxidation resistant layer 1040-1. Subsequently, a lower electrode 1006-1, a dielectric layer 1008, and an upper electrode 1012 are stacked in this order. In this process, the conductive layer 1030 and the oxidation-blocking layer 1040-1 is covered with the lower electrode 1006-1.

The process steps of fabricating method of the capacitor according to the fifth embodiment will be explained with reference to FIGS. 14A to 14D.

Figure 14A:
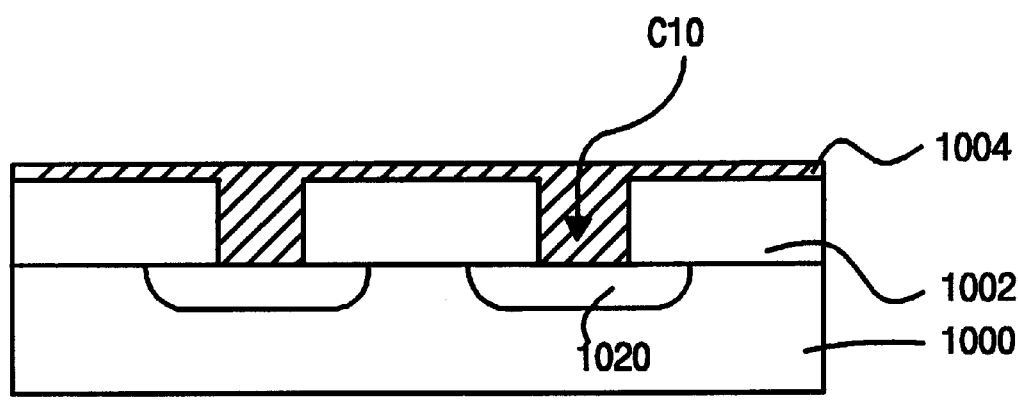
FIGS. 14A to 14D are cross-sectional views illustrating the process steps of fabricating capacitors according to the fifth embodiment of the present invention.

Referring to FIG. 14A, a first insulating layer 1002 is formed on a semiconductor substrate 1000 to have a contact hole C10 exposing a heavily-doped impurity region 1020 (a source/drain). A first conductive layer 1004 filling the contact hole C10 is formed on the first insulating layer 1002.

Figure 14B:
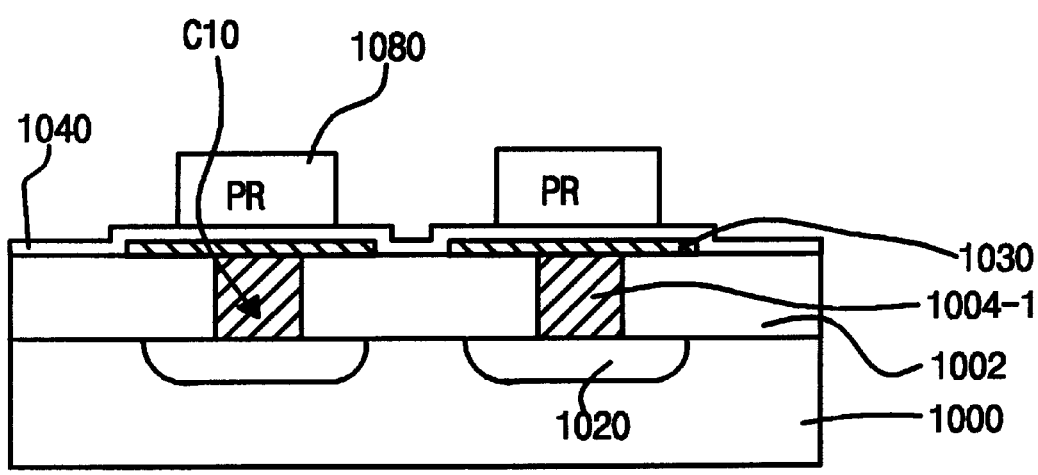

In FIG. 14B, a plug 1004-1 is formed by etching back the first conductive layer 1004 to expose the surface of the first insulating layer 1002. A second conductive layer 1030 is then formed on the insulating layer 1002 to cover the plug 1004-1. A second insulating layer 1040 is formed by depositing oxide on the first insulating layer 1002 and the second conductive layer 1030. Then, a first photoresist pattern 1080 is defined on the second insulating layer 1040 over the plug 1004-1.

Figure 14C:
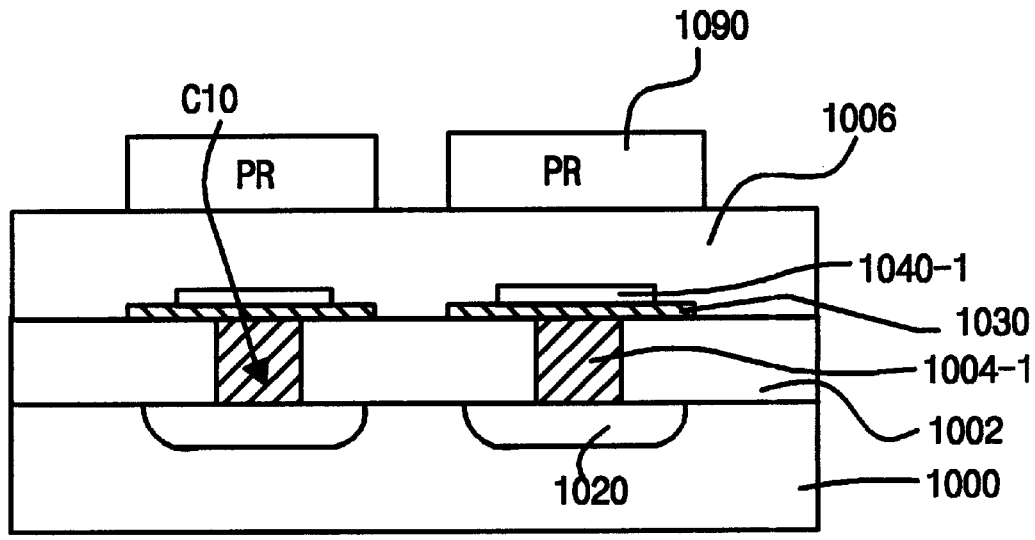

Referring to FIG. 14C, an oxidation resistant layer 1040-1 is formed by removing a portion of the second insulating layer in use of the first photoresist pattern 1080 as an etch mask. The oxidation resistant layer 1040-1 prevents the plug from being oxidized by oxygen diffusion through the lower electrode of a capacitor when a thermal treatment is executed for forming a dielectric layer. In this process, the second conductive layer 1030 should be formed to completely cover the lower surface of the oxidation resistant layer 1040-1. Thereafter, the first photoresist pattern is removed from the second insulating layer 1040.

A third conductive layer 1006 is formed to cover the second conductive layer 1030, the oxidation-blocking layer 1040-1, and the first insulating layer 1002. Then, a second photoresist pattern 1090 defining a lower electrode is formed on the third conductive layer 1006.

Figure 14D:
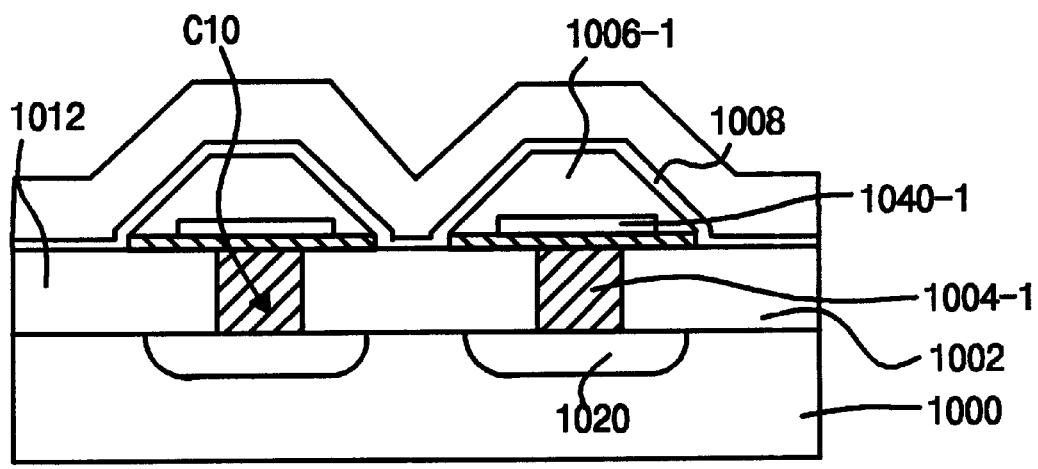

Referring to FIG. 14D, a lower electrode 1006-1 is formed by removing a portion of the third conductive layer 1006 using the second photoresist pattern 1090 as an etch mask. In this process, the lower electrode 1006-1 is patterned to have a slant side. The second photoresist pattern 1090 is then removed from the third conductive layer 1006. A dielectric layer 1008 covering the lower electrode 1006-1 including a portion of the first insulating layer 1002 is formed by depositing a high dielectric material. Subsequently, the capacitor according to the fifth amendment of the present invention is completed by forming an upper electrode 1012 on the dielectric layer 1008.

As described above, although the plug is not directly connected to the lower electrode, it is electrically coupled to the lower electrode through the oxidation resistant layer and the second conductive layer. Accordingly, the oxidation resistant layer and the second conductive layer prevent oxidation of the plug during the thermal treatment for forming the dielectric layer.

As explained above, although the plug is not in directly contact with the lower electrode, it is still electrically coupled to the lower electrode through the conductive layer and a contact resistance therein is lowered. As a result, the plug is free from oxidation even though the oxygen is passed through the lower electrode.

Further, an effective area for a capacitor per unit area is maximized by forming the insulating layer to have a slant side. Also, by reducing the area, the surface of the plug is to be utilized for an extra area for a capacitor.

It will be apparent to those skilled in the art that various modifications and variations can be made in a capacitor and fabricating method thereof of the present invention without departing from the spirit or scope of the inventions. Thus, it is intended that the present invention cover the modifications and variations of this invention provided they come within the scope of the appended claims and their equivalents.

What is claimed is:

1. A method of fabricating a capacitor having a semiconductor substrate, the method comprising the steps of:

forming an impurity region on the semiconductor substrate;

forming a first insulating layer on the semiconductor substrate;

forming a first contact hole to expose the impurity region in the first insulating layer;

forming a first conductive plug in the first contact hole;

forming a conductive layer on the first insulating layer and the first conductive plug;

forming a second insulating layer on the first insulating layer and the first conductive layer;

forming a second contact hole in the second insulating layer, the second contact hole having a second conductive plug in contact with the conductive layer;

forming a lower electrode on the second insulating layer and the second conductive plug;

forming a dielectric layer on the lower electrode; and forming an upper electrode on the dielectric layer.

2. The method according to claim 1, wherein the step of forming the lower electrode further comprises the steps of:

forming a lower electrode conductive layer on the second insulating layer and the second conductive plug;

forming a filling layer on the lower electrode conductive layer to plagiarize the lower electrode conductive layer;

removing the filling layer and a portion of the lower electrode conductive layer to expose a portion of the second insulating layer; and removing any remaining portion of the filling layer.

3. The method according to claim 2, wherein the filling layer comprises one of spin on glass (SOG) and photoresist.

4. The method according to claim 2, further comprising the steps of forming a lower electrode conductive layer on the second insulating layer, the lower electrode conductive layer being electrically coupled to the conductive layer.

5. The method according to claim 1, wherein the conductive layer comprises a metal layer or an oxidized conductive layer.

6. The method according to claim 1, wherein the second insulating layer has at least one slant side.

7. The method according to claim 1, wherein the first insulating layer comprises silicon oxide.

8. The method according to claim 1, wherein the first conductive layer comprises at least one of doped-silicon and tungsten.

9. The method according to claim 1, further comprising the steps of forming an adhesive layer between the conductive layer and the second insulating layer.

10. The method according to claim 1, wherein the lower electrode contacts the second conductive lug.

11. A method of fabricating a capacitor having a semiconductor substrate, the method comprising the steps of:

forming an impurity region in the semiconductor substrate;

forming a first insulating layer on the semiconductor substrate, the first insulating layer having a first contact hole to expose the impurity region;

forming a first conductive layer in the contact hole;

forming a second conductive layer on the first insulating layer, the second conductive layer having first and second end portions;

forming an oxidation resistant layer on the second conductive layer, the oxidation resistant layer having a width shorter than the second conductive layer;

forming a second insulating layer on the first insulating layer including the second conductive layer, the second insulating layer contacting the first end portion of the second conductive layer;

forming a lower electrode having a slant side over the second insulating layer;

forming a dielectric layer on the lower electrode including the first insulating layer; and forming an upper electrode on the dielectric layer.

12. The method according claim 11, further comprising an adhesive layer between the second conductive layer and the second insulating layer.

13. The method according to claim 11, wherein the lower electrode contacts both the first and second end portions of the second conductive layer.

* * * * *